US012369410B2

(12) United States Patent
Mazzillo et al.

(10) Patent No.: US 12,369,410 B2
(45) Date of Patent: Jul. 22, 2025

(54) LOW NOISE GEIGER-MODE AVALANCHE PHOTODIODE AND MANUFACTURING PROCESS

(71) Applicant: STMICROELECTRONICS S.r.l., Agrate Brianza (IT)

(72) Inventors: Massimo Cataldo Mazzillo, Corato (IT); Valeria Cinnera Martino, Valverde (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/608,301

(22) Filed: Mar. 18, 2024

(65) Prior Publication Data

US 2024/0266459 A1 Aug. 8, 2024

Related U.S. Application Data

(63) Continuation of application No. 17/534,159, filed on Nov. 23, 2021, now Pat. No. 11,961,933, which is a continuation of application No. 16/508,039, filed on Jul. 10, 2019, now Pat. No. 11,189,744.

(30) Foreign Application Priority Data

Jul. 16, 2018 (IT) .................. 102018000007231

(51) Int. Cl.
*H10F 39/10* (2025.01)
*H10F 30/225* (2025.01)
*H10F 71/00* (2025.01)
*H10F 77/14* (2025.01)

(52) U.S. Cl.
CPC ....... *H10F 30/2255* (2025.01); *H10F 39/103* (2025.01); *H10F 71/00* (2025.01); *H10F 77/14* (2025.01)

(58) Field of Classification Search
CPC ......... H10F 39/103; H10F 71/00; H10F 77/14
See application file for complete search history.

(56) References Cited

U.S. PATENT DOCUMENTS

| 6,870,239 | B1 | 3/2005 | Clark |
| 7,341,921 | B2 | 3/2008 | Jackson et al. |
| 8,264,019 | B2 | 9/2012 | Mazzillo |
| 9,105,789 | B2 | 8/2015 | Mazzillo et al. |
| 9,299,873 | B2 | 3/2016 | Mazzillo et al. |
| 11,189,744 | B2 | 11/2021 | Mazzillo et al. |

(Continued)

OTHER PUBLICATIONS

Acerbi et al., "NUV Silicon Photomultipliers With High Detection Efficiency and Reduced Delayed Correlated-Noise," *IEEE Transactions on Nuclear Science* 62(3):1318-1325, Jun. 2015.

(Continued)

*Primary Examiner* — Mark V Prenty
(74) *Attorney, Agent, or Firm* — Seed IP Law Group LLP

(57) ABSTRACT

In at least one embodiment, a Geiger-mode avalanche photodiode, including a semiconductor body, is provided. The semiconductor body includes a semiconductive structure and a front epitaxial layer on the semiconductive structure. The front epitaxial layer has a first conductivity type. An anode region having a second conductivity type that is different from the first conductivity type extends into the front epitaxial layer. The photodiode further includes a plurality of gettering regions in the semiconductive structure.

20 Claims, 12 Drawing Sheets

(56) References Cited

U.S. PATENT DOCUMENTS

| | | |
|---|---|---|
| 11,961,933 B2 * | 4/2024 | Mazzillo ............... H10F 30/225 |
| 2009/0184317 A1 | 7/2009 | Sanfilippo et al. |
| 2009/0184384 A1 | 7/2009 | Sanfilippo et al. |
| 2010/0148040 A1 | 6/2010 | Sanfilippo et al. |
| 2014/0339398 A1 | 11/2014 | Mazzillo et al. |

OTHER PUBLICATIONS

Teranishi, "Dark Current and White Blemish in Image Sensors," IEEE International Symposium on VLSI Technology, Systems, and Applications, Apr. 22, 2013, 4 pages.

\* cited by examiner

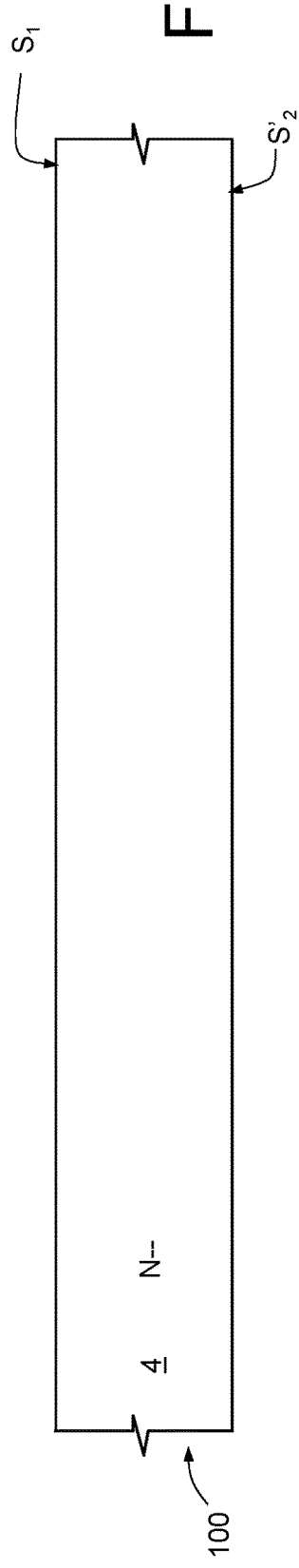
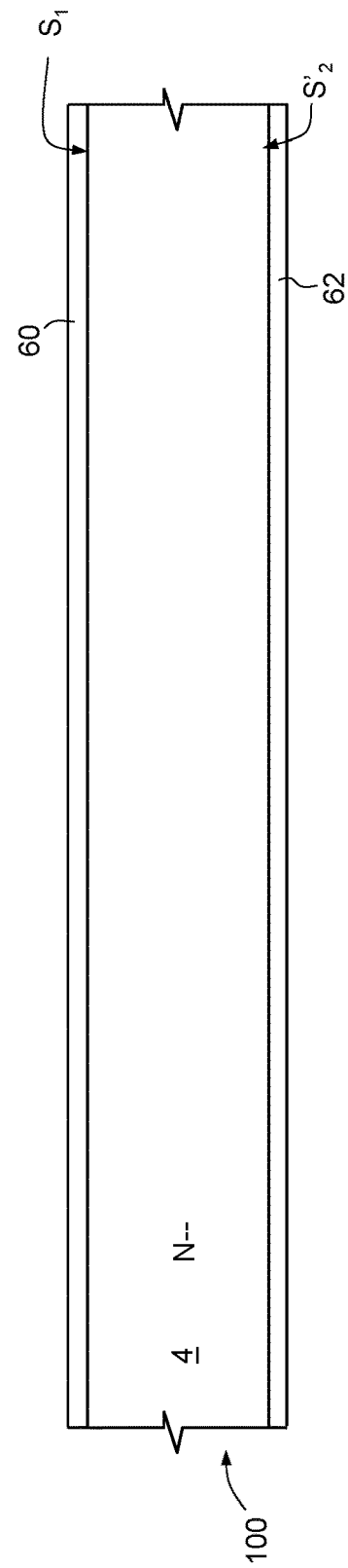
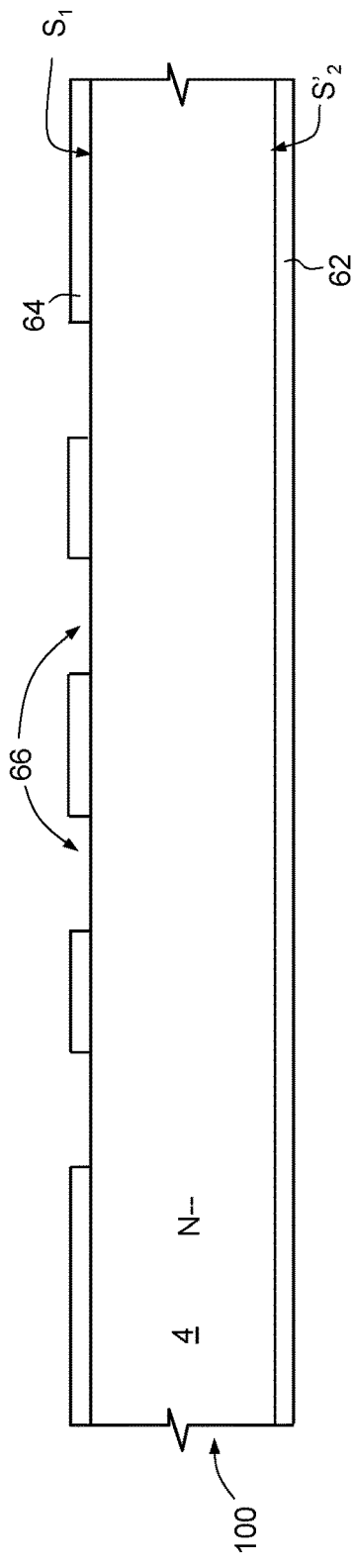

LOW NOISE GEIGER-MODE AVALANCHE PHOTODIODE AND MANUFACTURING PROCESS

BACKGROUND

Technical Field

The present disclosure relates to a low noise Geiger-mode avalanche photodiode and to processes of manufacturing low noise Geiger-mode avalanche photodiodes.

Description of the Related Art

As is known, today available are the so-called Geiger-mode avalanche photodiodes (GMAPs), also known as single-photon avalanche diodes (SPADs).

A SPAD is formed by an avalanche photodiode (APD), and hence comprises a junction made of semiconductor material, which has a breakdown voltage $V_B$ and is biased, in use, with a reverse-biasing voltage $V_A$ higher in modulus than the breakdown voltage $V_B$, which, as is known, depends upon the semiconductor material and upon the doping level of the least doped region of the junction itself. In this way, the junction has a particularly extensive depleted region, inside which a non-negligible electrical field is present. Hence, generation of a single electron-hole pair, caused by absorption in the depleted region of a photon impinging upon the SPAD, may be sufficient to trigger an ionization process. This ionization process in turn causes an avalanche carrier multiplication, with gains of around $10^6$, and consequent generation in short times (hundreds of picoseconds) of the so-called avalanche current, or more precisely of a pulse of the avalanche current (more briefly, avalanche pulse).

The avalanche current can be collected, typically by means of an external circuitry connected to the junction, and represents an output signal of the SPAD, which will also be referred to as "output current". In practice, for each photon absorbed, a pulse of the output current of the SPAD is generated.

The fact that the reverse-biasing voltage $V_A$ is higher than the breakdown voltage $V_B$ causes the avalanche ionization process, once triggered, to be self-sustaining. Consequently, once the ionization process is triggered, the SPAD is no longer able to detect photons; in order to be able to detect also subsequent photons, the avalanche ionization process should be stopped, by lowering, for a period of time known as hold-off time, the effective voltage across the junction. For this purpose, it is known to use so-called quenching circuits, whether of an active type or of a passive type; for example, in the case of passive quenching, the quenching circuits may be formed by integrated resistors.

Moreover, the so-called SPAD arrays are known. Each array is formed by a planar matrix of SPADs, grown on one and the same substrate. The anode and cathode electrodes of the SPADs can be connected together so that the SPADs can be biased at one and the same reverse-biasing voltage $V_A$, in which case the array forms a so-called silicon photomultiplier (SiPM). Moreover, in the case of a SiPM, the SPADs are provided with respective quenching resistors (for example, of a vertical type), which are integrated in the SPADs and are decoupled from one another and independent. In addition, the avalanche currents generated within the SPADs are multiplexed together so as to generate an output signal of the SiPM equal to the summation of the output signals of the SPADs, this output signal hence being proportional to the number of photons that impinge upon the SiPM.

This having been said, any array of SPADs is affected by the phenomenon of optical crosstalk.

In detail, given any SPAD of an array, the corresponding operation is affected by the photons generated by electroluminescence during processes of avalanche multiplication triggered in surrounding SPADs.

In greater detail, it is known that the SPADs operating above the breakdown voltage, and in particular the corresponding depleted regions, emit in an isotropic way secondary photons, on account of different mechanisms such as (direct and indirect) interband recombinations. The secondary photons are generally emitted within a range of wavelengths comprised between 400 nm and 2 μm, with a likelihood of emission that depends upon the reverse-biasing voltage $V_A$ applied.

The secondary photons can propagate and be subsequently absorbed in the depleted regions of the adjacent SPADs, in which case the so-called prompt crosstalk arises.

Moreover, denoting as "original SPAD" a photodiode in the depleted region of which a secondary photon has been emitted, and as "minority carrier" a minority carrier generated in a non-depleted portion (for example, the substrate) of the array following upon absorption of the secondary photon, this minority carrier (for example, a hole, in the case of a substrate of an N type) can diffuse until the depleted region of i) the original SPAD or else ii) another SPAD of the array is reached, causing generation of corresponding avalanche pulses; in particular, in the aforementioned cases i) and ii), the avalanche pulse concurs, respectively, in the so-called phenomena of afterpulsing and delayed crosstalk (CT-D). Moreover, since the diffusion process is rather slow (equivalently, the lifetime of the minority carriers is long), the avalanche pulses thus generated present long delays (of the order of hundreds of microseconds) as compared to the avalanche pulses generated following upon absorption in the depleted regions of the photons of the radiation to be detected (the so-called primary photons).

In practice, with reference, for example, to delayed crosstalk, this causes an increase of the so-called dark-noise rate, in addition to a reduction of the dynamics of the array and the impossibility of quenching the avalanche currents in short times. These disadvantages emerge, in particular, in the case of arrays that include photodiodes of large dimensions operating at biasing voltages that are high (in modulus). To overcome at least in part these problems, it is possible to reduce the size of the photodiodes of the array and/or reduce the biasing voltage; however, this entails a reduction of the gain of each photodiode and a reduction of the sensing efficiency.

BRIEF SUMMARY

In various embodiments, the present disclosure provides a SPAD that will enable the drawbacks of the prior art to be solved at least partially.

According to the disclosure, a SPAD and a manufacturing process are provided.

In an embodiment, a Geiger-mode avalanche photodiode is provided that includes a semiconductor body that includes a semiconductive structure, a front epitaxial layer on the semiconductive structure, and an anode region extending into the front epitaxial layer. The front epitaxial layer has a first conductivity type, and the anode region has a second conductivity type that is different from the first conductivity type. A plurality of gettering regions is disposed in the semiconductive structure.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein:

FIGS. 6-13 are schematic illustrations of cross sections of a photodiode, during successive steps of a manufacturing process;

DETAILED DESCRIPTION

The present photodiode stems from some observations of the present applicant. In particular, the present applicant has noted how, in an array of SPADs, the likelihood of there being an occurring phenomena of afterpulsing and delayed crosstalk decreases the closer the junctions of the SPADs are to corresponding non-depleted semiconductor regions having large thicknesses and high doping levels. In other words, in this way, the lifetime of the aforementioned minority carriers is reduced.

Figure 1:
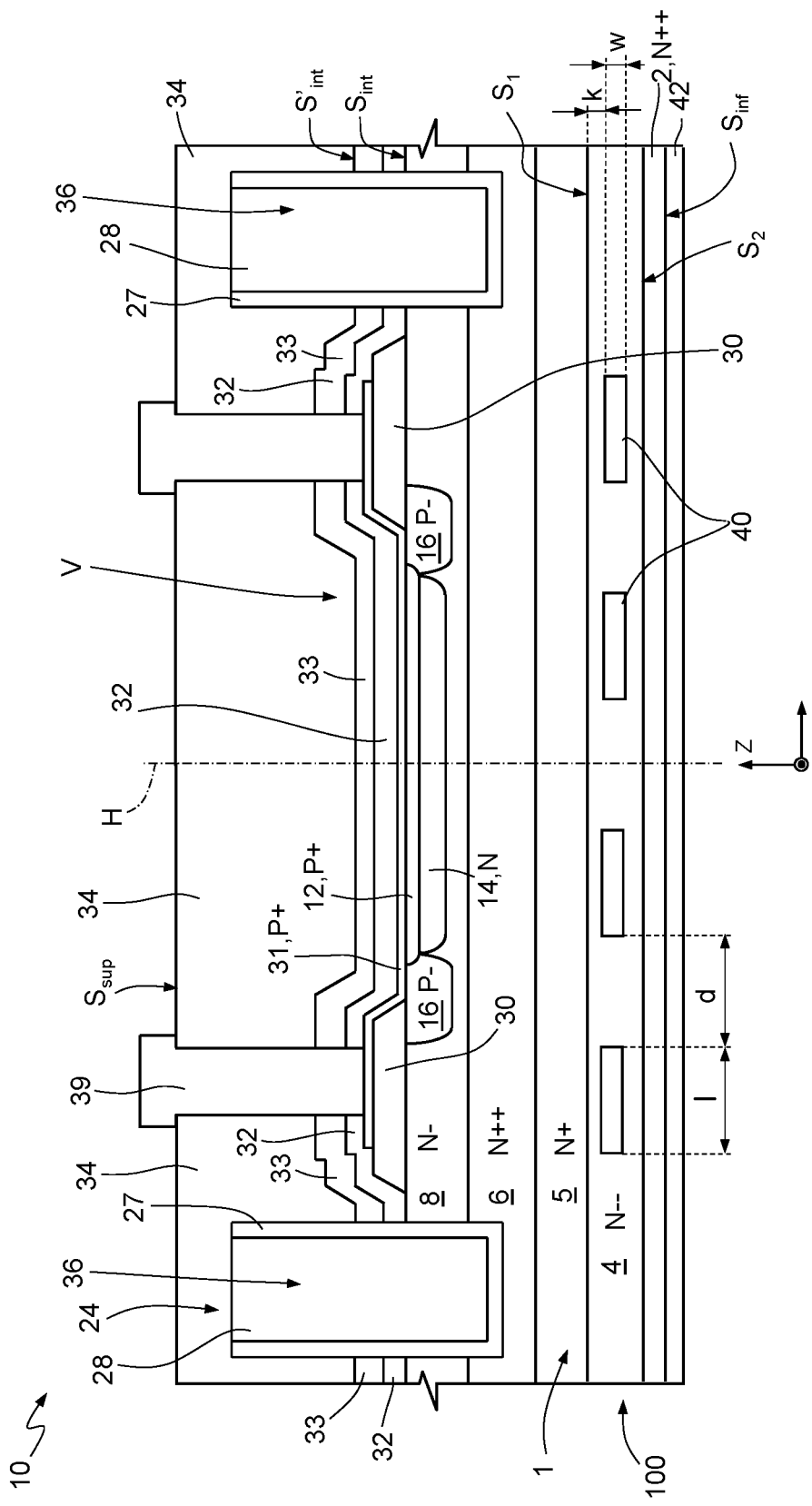
FIG. 1 is a schematic perspective view of a photodiode, in accordance with one or more embodiments of the present disclosure.
Figure 2:
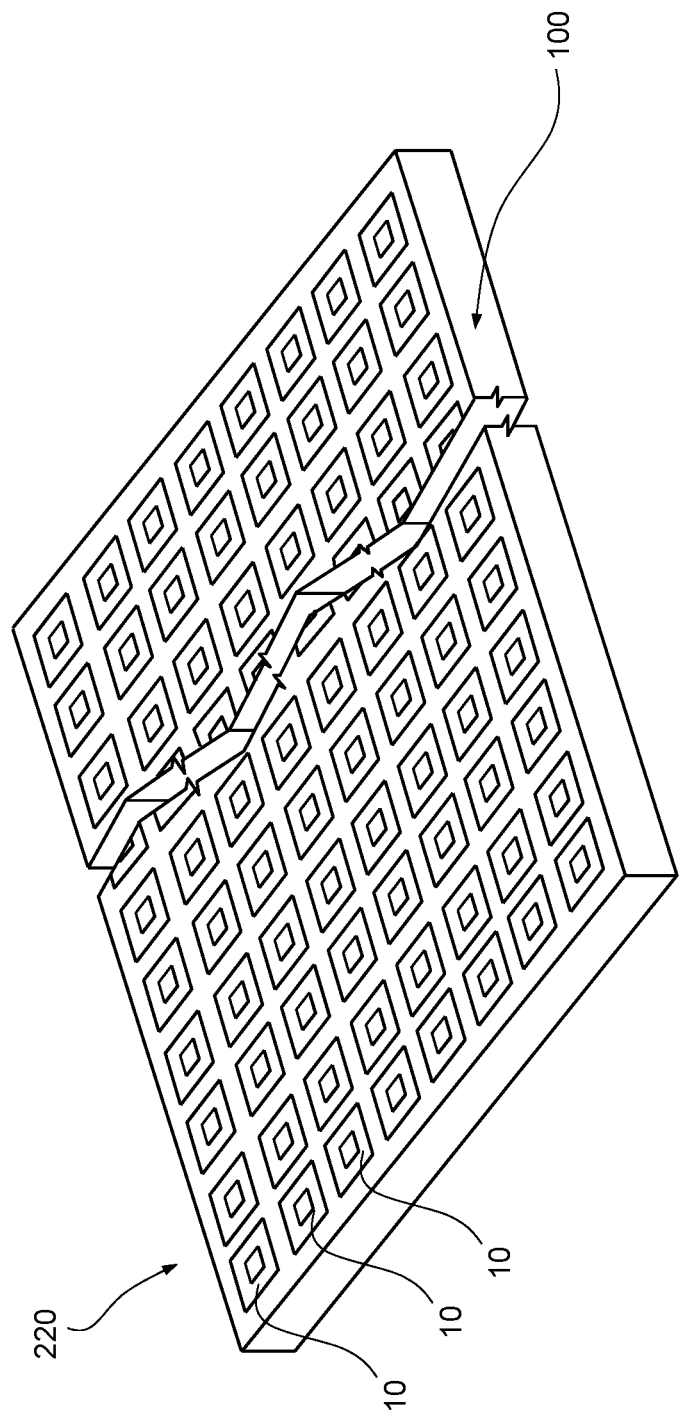
FIG. 2 is a schematic perspective view of an array of photodiodes, in accordance with one or more embodiments.

This having been said, FIG. 1 shows a photodiode 10, which is integrated in a die 100 of semiconductor material. As shown in FIG. 2, the photodiode 10 may form part of an array 220 of photodiodes that are the same as one another, all of which are designated by 10.

In detail, the photodiode 10 comprises a semiconductor body 1, which is made, for example, of silicon and in turn comprises a substrate 4, and a first epitaxial layer 5, a second epitaxial layer 6, and a third epitaxial layer 8; moreover, the semiconductor body 1 comprises a rear contact region 2. In FIG. 1, as likewise in the subsequent figures, the thicknesses are not in scale.

The substrate 4 is of an N-- type, has a thickness, for example, of between 80 μm and 200 μm and has a doping level, for example, of between $5 \times 10^{13}$ cm$^{-3}$ and $1 \times 10^{14}$ cm$^{-3}$.

The first epitaxial layer 5 is of an N+ type, has a thickness, for example, of between 4 μm and 8 μm and overlies the substrate 4, in direct contact therewith. In addition, the first epitaxial layer 5 has a doping level, for example, of between $1 \times 10^{16}$ cm$^{-3}$ and $1 \times 10^{17}$ cm$^{-3}$.

The second epitaxial layer 6 is of an N++ type, has a thickness, for example, of between 10 μm and 15 μm and overlies the first epitaxial layer 5, with which it is in direct contact. Moreover, the second epitaxial layer 6 has a doping level, for example, of between $1 \times 10^{19}$ cm$^{-3}$ and $5 \times 10^{19}$ cm$^{-3}$.

The third epitaxial layer 8 is of an N- type, has a thickness, for example, of between 3 μm and 5 μm and overlies the second epitaxial layer 6, with which it is in direct contact. Moreover, the third epitaxial layer 8 has a doping level, for example, of between $1\ 10^{14}$ cm$^{-3}$ and $3\ 10^{14}$ cm$^{-3}$. In addition, the third epitaxial layer 8 forms a first intermediate surface $S_{int}$, which delimits the semiconductor body 1 at the top.

The rear contact region 2 is of an N++ type, has a thickness, for example, of between 0.1 μm and 1 μm and is arranged underneath the substrate 4, with which it is in direct contact. Moreover, the rear contact region 2 has a doping level, for example, of between $1\ 10^{19}$ cm$^{-3}$ and $1\ 10^{20}$ cm$^{-3}$. The rear contact region 2 is delimited at the bottom by a bottom surface $S_{inf}$.

An anode region 12, of a P+ type and of a circular or polygonal (for example, quadrangular) shape, in top plan view, gives out onto the first intermediate surface $S_{int}$ and extends within the third epitaxial layer 8. In particular, the anode region 12 has a thickness, for example, of between 0.05 μm and 0.4 μm. Moreover, the anode region 12 has a doping level, for example, of between $1\ 10^{18}$ cm$^{-3}$ and $1\ 10^{19}$ cm$^{-3}$.

An enriched region 14, of an N type, extends in the third epitaxial layer 8, underneath, and in direct contact with, the anode region 12. In top plan view, the enriched region 14 has a circular or polygonal (for example, quadrangular) shape. Moreover, the enriched region 14 has a thickness, for example, of 1 μm and a doping level, for example, of between $1\ 10^{16}$ cm$^{-3}$ and $5\ 10^{16}$ cm$^{-3}$.

For practical purposes, the anode region 12 and the enriched region 14 form a first PN junction, designed to receive photons and to generate the avalanche current. The enriched region 14 and the third epitaxial layer 8 have, instead, the purpose of confining a high electrical field in the proximity of the first PN junction, reducing the breakdown voltage $V_B$ of the first PN junction.

A guard ring 16 of a circular shape, of a P- type and with a doping level of between $1\ 10^{16}$ cm$^{-3}$ and $3\ 10^{16}$ cm$^{-3}$, extends in the third epitaxial layer 8. In particular, the guard ring 16 gives out onto the first intermediate surface $S_{int}$ and is arranged on the outside of the anode region 12, with which it is in direct contact. Moreover, the guard ring 16 has a thickness, for example, of between 1 μm and 3 μm.

The guard ring 16 forms a second PN junction with the second epitaxial layer 8 so as to prevent edge breakdown of the anode region 12.

The photodiode 10 further comprises a cathode metallization 42, made of metal material, which extends underneath the bottom surface $S_{inf}$, in contact with the rear contact region 2. Albeit not illustrated, the cathode metallization 42 may be formed by a corresponding multilayer structure made of metal material.

The photodiode 10 further comprises a first dielectric region 30, which extends on the first intermediate surface $S_{int}$, is made, for example, of thermal oxide and has a thickness, for example, of 0.8 μm. In particular, in top plan view, the first dielectric region 30 has a hollow shape, such as the shape of an annulus or the shape of a polygonal frame. The first dielectric region 30 hence defines a recess that leaves the anode region 12 exposed. In other words, whereas the anode region 12 gives out onto a central portion of the first intermediate surface $S_{int}$, the first dielectric region 30 extends on part of a peripheral portion of the first intermediate surface $S_{int}$. Furthermore, the first dielectric region 30 extends partially over the guard ring 16, with which it is in direct contact, leaving a portion thereof that contacts the anode region 12 exposed.

The photodiode 10 further comprises a region 31, which in what follows will be referred to as "intermediate region 31".

In detail, the intermediate region 31 is made, for example, of polysilicon, is of a P+ type, has a doping level, for example, of between $1 \cdot 10^{20}$ cm$^{-3}$ and $3 \cdot 10^{20}$ cm$^{-3}$ and has a thickness, for example, of between 50 nm and 100 nm. Moreover, the intermediate region 31 extends, in direct contact, on the first dielectric region 30 and on the anode region 12, as well as on the portion of guard ring 16 left exposed by the first dielectric region 30.

In greater detail, and without this implying any loss of generality, the intermediate region 31 extends on an inner portion of the first dielectric region 30, which defines the aforementioned recess, whereas it leaves an outer portion of the first dielectric region 30 exposed.

The photodiode 10 further comprises a second dielectric region 32, which is made, for example, of TEOS oxide and has a thickness, for example, of between 0.1 μm and 0.2 μm.

In particular, the second dielectric region 32 extends, in direct contact, on the intermediate region 31, as well as on the outer portion of the first dielectric region 30 left exposed by the intermediate region 31. Moreover, denoting as "outer part of the peripheral portion of the first intermediate surface $S_{int}$" the part of the peripheral portion of the first intermediate surface $S_{int}$ left exposed by the first dielectric region 30, the second dielectric region 32 extends on said outer part of the peripheral portion of the first intermediate surface $S_{int}$, in contact with the third epitaxial layer 8.

The photodiode 10 further comprises a third dielectric region 33, which extends over the second dielectric region 32, in direct contact therewith, and is delimited at the top by a second intermediate surface $S'_{int}$. Moreover, the third dielectric region 33 is made, for example, of silicon nitride ($Si_3N_4$) and has a thickness, for example, of between 50 nm and 100 nm.

The photodiode 10 further comprises a fourth dielectric region 34, made, for example, of TEOS oxide, which extends, in direct contact, over the third dielectric region 33. For example, the fourth dielectric region 34 has a thickness of between 1 μm and 10 μm. In addition, the fourth dielectric region 34 is delimited at the top by a top surface $S_{sup}$.

The second, third, and fourth dielectric regions 32, 33, 34 form, in a way in itself known, an antireflective structure.

The photodiode 10 further comprises a lateral insulation region 24, which, in top plan view, has, for example, a hollow shape (for instance, the shape of an annulus or the shape of a quadrangular frame).

In particular, the lateral insulation region 24 is arranged in a trench 36, which extends through a bottom portion of the fourth dielectric region 34, as well as through the third dielectric region 33, the second dielectric region 32, the third epitaxial layer 8, and a part of the second epitaxial layer 6 so as to surround laterally the first dielectric region 30, the intermediate region 31, and the ring region 16. The trench 36 hence extends at a distance from the top surface $S_{sup}$.

In greater detail, assuming an orthogonal reference system XYZ having axes X and Y parallel to the first intermediate surface $S_{int}$, the trench 36 has an axis of symmetry H parallel to the axis Z, which may coincide with the axes of symmetry of the anode region 12, the guard ring 16, and the first dielectric region 30.

The lateral insulation region 24 comprises a channel-stopper region 27, arranged more externally, and a barrier region 28, arranged more internally.

The channel-stopper region 27 is made of dielectric material (for example, oxide) and is arranged in direct contact with the semiconductor body 1, and the second, third, and fourth dielectric regions 32, 33, 34; the channel-stopper region 27 coats the side walls and the bottom of the trench 36.

The barrier region 28 is made of a metal material (for example, tungsten) or of polysilicon and is surrounded laterally and at the bottom by the channel-stopper region 27, with which it is in direct contact. The barrier region 28 moreover contacts, at the top, the fourth dielectric region 34.

Purely by way of example, the trench 36 has a thickness invariant with respect to an angular co-ordinate of a cylindrical reference system with axis that coincides with the axis of symmetry H; this thickness may for example, be 15 μm. Moreover, the barrier region 28 has a width of, for example, 1 μm, whereas the channel-stopper region 27 has a thickness, for example, of 25 nm.

Operatively, the lateral insulation region 24 performs the function of preventing secondary photons generated in the SPAD 1 from being absorbed by adjacent SPADs.

The photodiode 10 further comprises an anode metallization 39, which has, for example, an annular shape and traverses the second, third, and fourth dielectric regions 32, 33, 34 so as to contact the intermediate region 31. In this way, given the arrangement of the anode metallization 39, the avalanche current generated by the photodiode 10 flows parallel to the axis of symmetry H.

Albeit not illustrated, the photodiode 10 may also comprise a quenching resistor, formed, for example, by a corresponding polysilicon region (not shown), which extends, for example, in the third dielectric region 33 and is in electrical contact with the anode metallization 39.

In addition, the photodiode 10 comprises a plurality of gettering regions 40, which extend in the substrate 4. In particular, denoting as "first and second surfaces $S_1$, $S_2$" the surfaces that delimit the substrate 4 at the top and at the bottom, respectively, the gettering regions 40 extend at a distance from the first and second surfaces $S_1$, $S_2$; moreover, the gettering regions 40 have a planar distribution and are arranged, in top plan view, within the lateral insulation region 24.

Without this implying any loss of generality, in the embodiment shown in FIG. 1, the gettering regions 40 are the same as one another. Each of the gettering regions 40 moreover has, to a first approximation, the shape of a parallelepiped with a height parallel to the axis X, a length l (measured along the axis Y), for example, of between 2 μm and 10 μm, and a width w (measured along the axis Z), for example, of between 0.5 μm and 2 μm. Moreover, adjacent gettering regions 40 are arranged at a distance d from one another (measured along the axis Y), for example, of between 2 μm and 5 μm. In addition, the gettering regions 40 are set at a distance k from the first surface $S_1$, for example, of between 0.5 μm and 2 μm.

In greater detail, the gettering regions 40 are modified portions of the substrate 4, which have a high lattice defectiveness. In particular, the gettering regions 40 are amorphous semiconductor regions. For example, as described in greater detail hereinafter, the gettering regions 40 may be formed by implantation. Operatively, the gettering regions 40 function as centers for collection of the metal impurities.

For practical purposes, the enriched region 14, the substrate 4, and the first, second, and third epitaxial layers 5, 6, 8 form a cathode region of the photodiode 10. Moreover, the array 220 of photodiodes 10 forms a silicon photomultiplier (SiPM), in which the photodiodes 10 are substantially subjected to one and the same biasing. In this connection, albeit not illustrated, the anode metallizations 39 and cathode metallizations 42 of the photodiodes 10 of the array 220 are configured so as to enable connection of all of them to one and the same voltage generator.

This having been said, the photodiode 10 is characterized by the short lifetime of the minority carriers that are generated following upon absorption of secondary photons in the non-depleted region of the photodiode 10, and hence in the substrate 4, and in the first, second, and third epitaxial layers 5, 6, 8.

In detail, in the gettering regions 40, the aforementioned lifetime of the minority carriers is particularly short on account of the high defectiveness. In other words, after a minority carrier has reached, by diffusion, a gettering region 40, it has a high probability of recombining in short times, without interfering with the junctions of the photodiodes.

Moreover, the first and second epitaxial layers 5, 6 form a sort of heavily doped recombination region, arranged close to the junction present between the anode region 12 and the enriched region 14. The present applicant has noted how the lifetime of the aforementioned minority carriers decreases as the doping of the aforementioned recombination region increases, and moreover as the distance between said recombination region and the junction decreases. The light doping of the third epitaxial layer 8 prevents, instead, edge breakdown of the junction.

Figure 3:
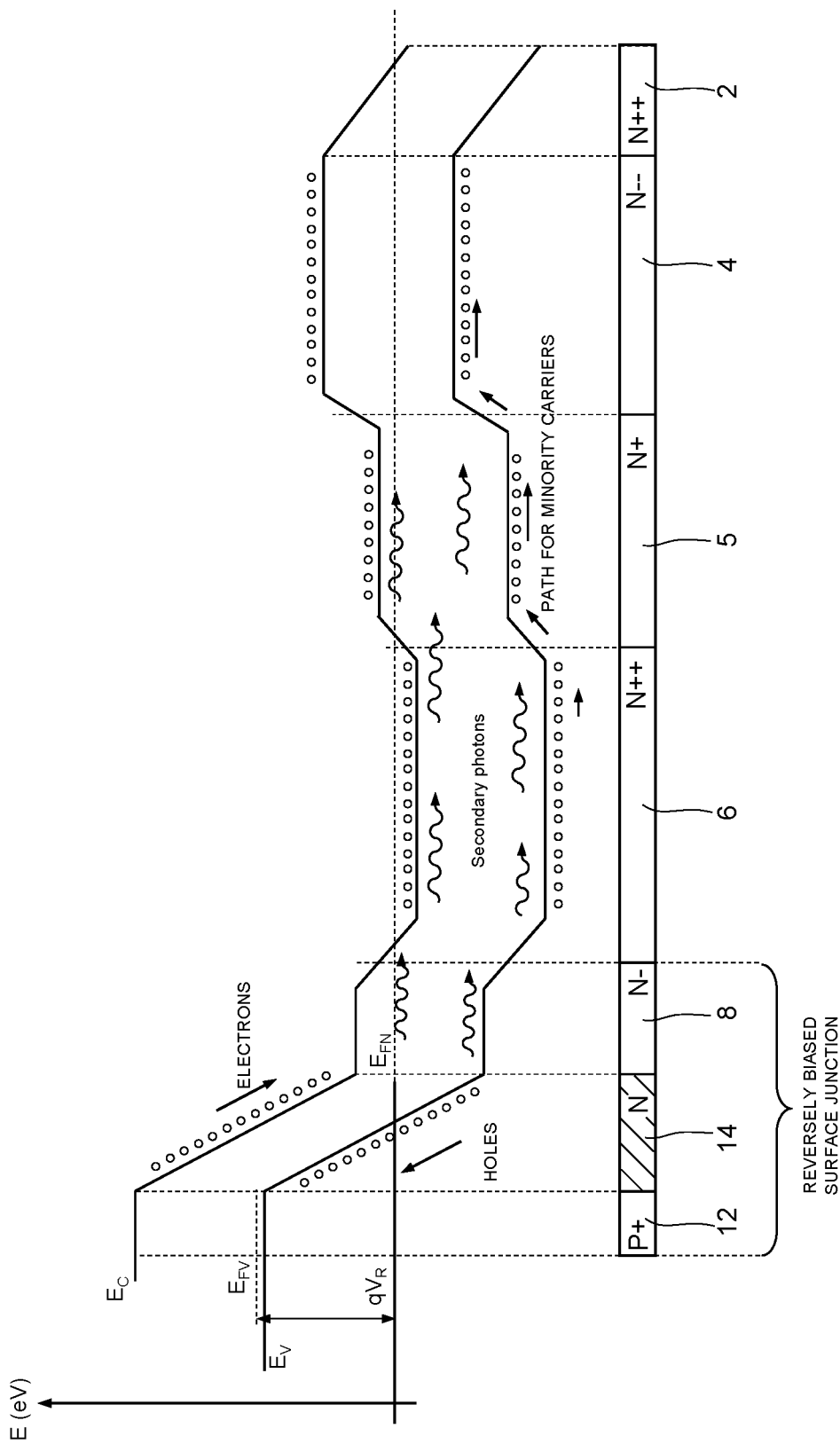
FIG. 3 is a schematic illustration showing plots of energy levels in an embodiment of photodiodes provided by the present disclosure.

In addition, as shown qualitatively in FIG. 3 (not in scale), the second epitaxial layer 6, the first epitaxial layer 5, and the substrate 4 form a sort of decreasing scale of doping profiles; consequently, the profile of the valence band (designated by $E_V$, whereas $E_C$, $E_{FV}$, $E_{FC}$, and $qV_R$ denote, respectively, the conduction band, the Fermi levels in the anode region and in the cathode region of the junction, and the energy associated to a reverse biasing voltage $V_R$) defines a path for the minority carriers (in the case in point, holes), this path extending from the second epitaxial layer 6 as far as the substrate 4. Without this implying any loss of generality, in this embodiment the path comprises two steps (in particular, a first step, formed by the first and second epitaxial layers 5, 6, and a second step, formed by the substrate 4 and by the first epitaxial layer 5). In FIG. 3 it is assumed that, to a first approximation, the enriched region 14 is entirely depleted.

In practice, in the case where a secondary photon is absorbed in the substrate 4 or in the first epitaxial layer 5 or second epitaxial layer 6, the corresponding hole generated has a preferential path towards the substrate 4, instead of towards the junction of the photodiode 10 or towards the junctions of adjacent photodiodes; hence, it has a lower likelihood of contributing to noise. Moreover, said hole is likely to recombine while it is following the aforementioned path.

Figure 4:
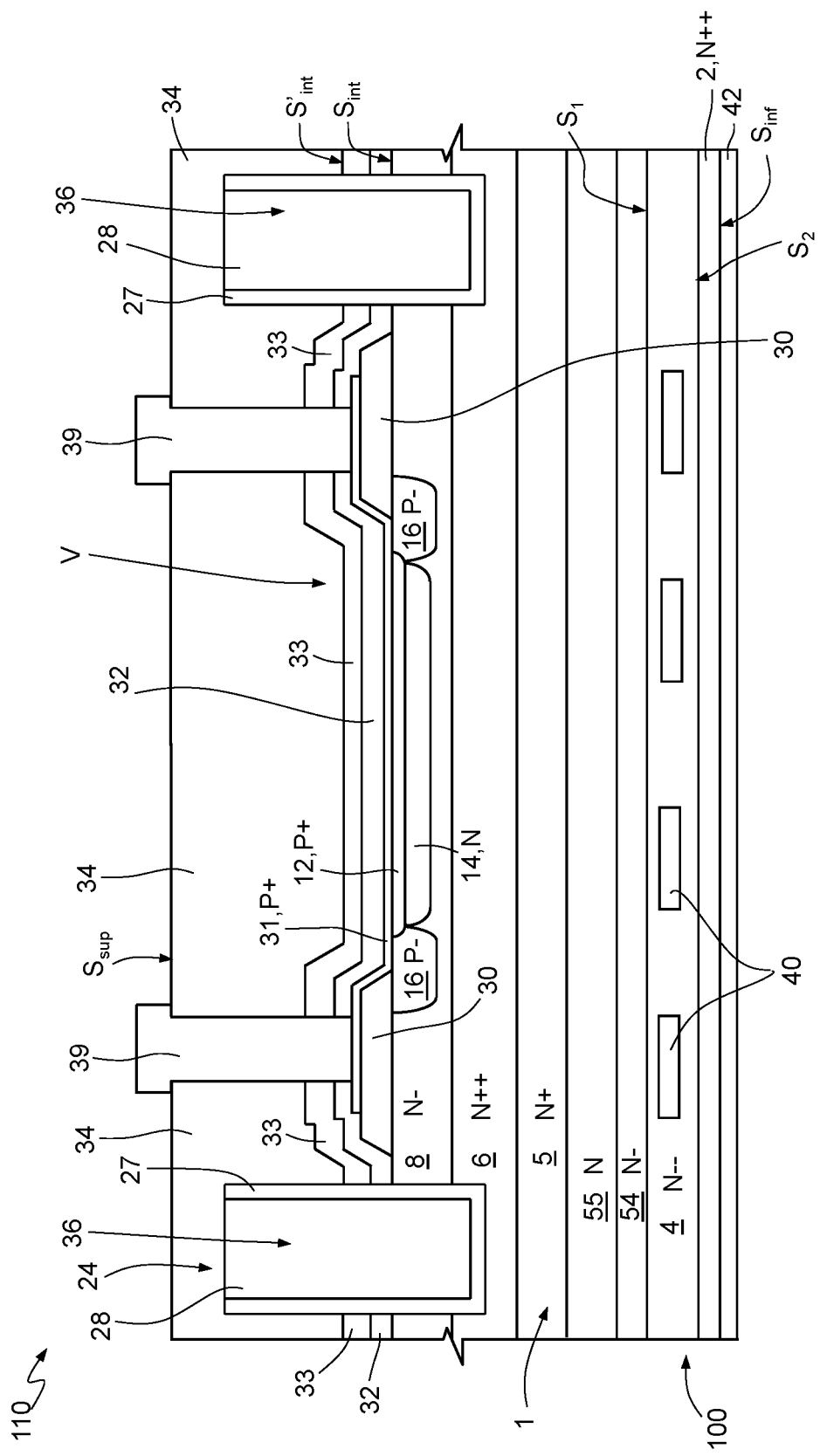
FIG. 4 is a schematic perspective view of another photodiode, in accordance with one or more embodiments.

In general, the number of steps of the aforementioned path for the minority carriers may vary. For example, FIG. 4 shows an embodiment of a photodiode 110 in which there are four steps. The photodiode 110 shown in FIG. 4 may include features which are substantially the same or similar to features of the photodiode 10 shown and described with respect to FIG. 1, and some of the differences will be discussed below. In particular, the semiconductor body 1 of the photodiode 110 comprises a fourth epitaxial layer 54 and a fifth epitaxial layer 55.

In detail, the fourth epitaxial layer 54 is of an N− type, has a thickness, for example, of between 3 μm and 5 μm, and overlies the substrate 4, in direct contact therewith. Moreover, the fourth epitaxial layer 54 has a doping level, for example, of between $1\times10^{14}$ cm$^{-3}$ and $1\times10^{15}$ cm$^{-3}$.

The fifth epitaxial layer 55 is of an N type, has a thickness, for example, of between 4 μm and 6 μm and is interposed, in direct contact, between the fourth epitaxial layer 54 and the first epitaxial layer 5. Moreover, the fifth epitaxial layer 55 has a doping level, for example, of between $1\times10^{15}$ cm$^{-3}$ and $1\times10^{16}$ cm$^{-3}$.

Figure 5:
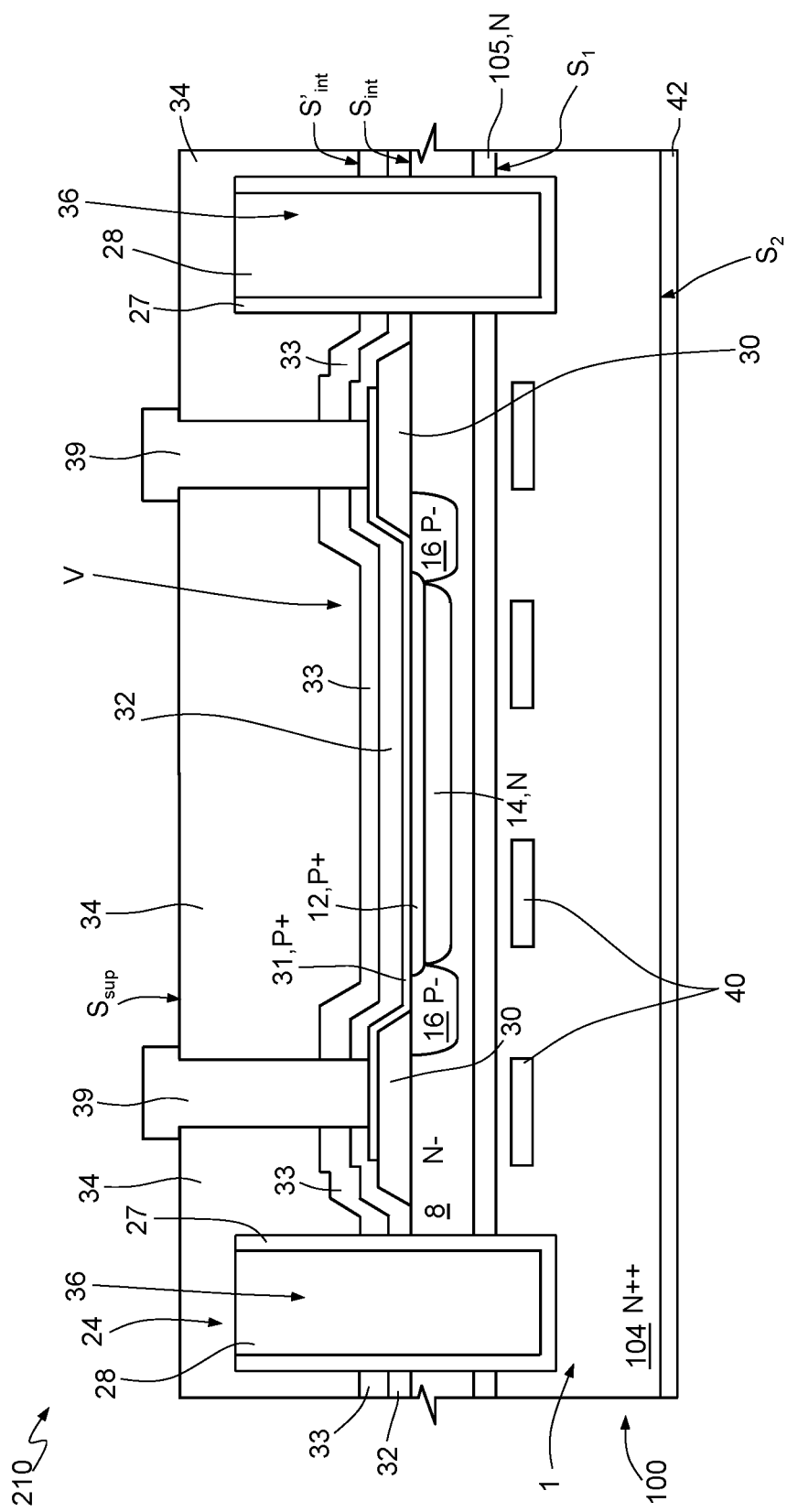
FIG. 5 is a schematic perspective view of yet another photodiode, in accordance with one or more embodiments.

However possible are also embodiments in which the stepwise path described previously is not envisaged. For example, FIG. 5 illustrates a photodiode 210 in which the substrate (here designated by 104) is of an N++ type; hence, it may have a doping level, for example, of between $1\times10^{19}$ cm$^{-3}$ and $5\times10^{19}$ cm$^{-3}$. Many of the features of the photodiode 210 shown in FIG. 5 may be substantially the same or similar to features of the photodiode 10 shown and described with respect to FIG. 1, and some of the differences will be discussed below.

The thickness of the substrate 104 may be once again of between 80 μm and 200 μm. Moreover, the semiconductor body 1 is without the rear contact region 2 and comprises, in addition to the substrate 104, an intermediate epitaxial layer 105 and the third epitaxial layer 8. The intermediate epitaxial layer 105 is interposed between the substrate 104 and the third epitaxial layer 8, is of an N type, has thickness, for example, of between 1 μm and 2 μm and has a doping level, for example, of between $5\times10^{16}$ cm$^{-3}$ and $1\times10^{17}$ cm$^{-3}$.

As shown once again in FIG. 5, the gettering regions 40 may extend within the volume delimited by the trench 36.

The various photodiodes provided herein may be obtained by means of the manufacturing process described hereinafter, with reference, purely by way of example, to the embodiment shown in FIG. 1.

Initially, as shown in FIG. 6, the substrate 4 is provided, which has a thickness, for example, of between 300 μm and 500 μm. As explained hereinafter, the substrate 4 is delimited at the top and at the bottom by the first surface $S_1$ and by a first temporary surface $S_2'$, respectively.

Next, a thermal annealing is carried out, in order to create a first dielectric layer 60 and a second dielectric layer 62, respectively, over the first surface $S_1$ and underneath the first temporary surface $S_2'$, as shown in FIG. 7. The first and second dielectric layers 60, 62 are hence made of thermal oxide and have a thickness, for example, of approximately 250 nm.

Next, as shown in FIG. 8, portions of the first dielectric layer 60 are selectively removed so as to pattern it. Albeit not illustrated, removal of portions of the first dielectric layer 60 may occur by carrying out a photolithographic process that envisages providing a resist mask (not shown) on the first dielectric layer 60 and carrying out a subsequent dry chemical etching. The remaining portions of the first dielectric layer 60 form a mask 64 of a hard type. The mask 64 delimits a plurality of windows 66, which give out onto the first surface $S_1$.

Figure 9:
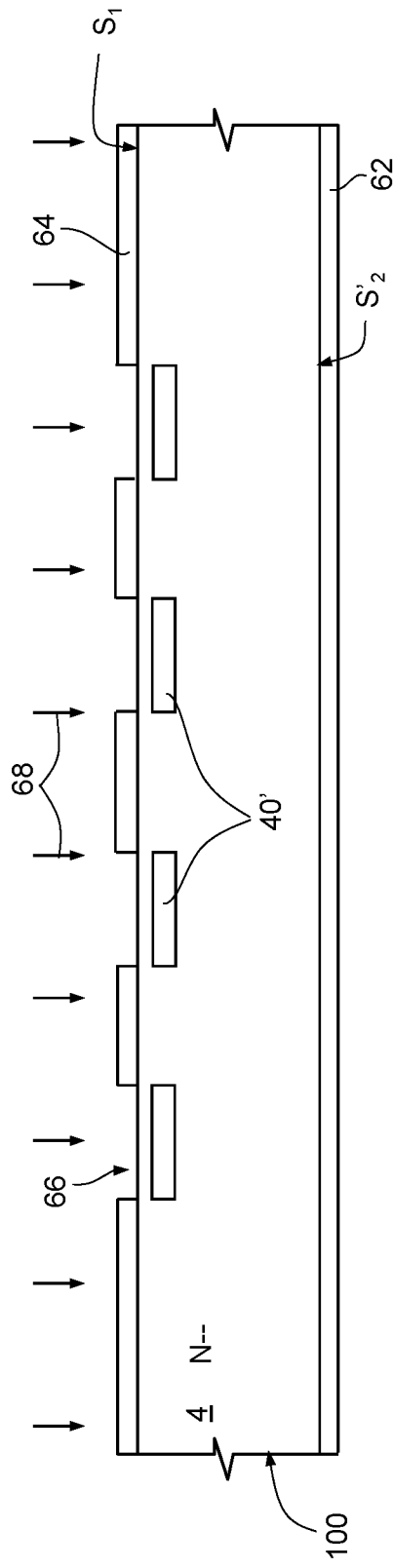

Next, after the aforementioned resist mask (not shown) has been removed, an implantation is made, represented by the arrows 68 shown in FIG. 9, so as to create in the substrate 4 preliminary regions 40′, designed to form the gettering regions 40. In particular, the implantation is carried out so as not to alter the doping of the substrate 4. In other words, through the windows 66 non-dopant species are implanted, such as hydrocarbon ions (for example, ions of $C_2H_5$ or $C_3H_5$), or else, once again by way of example, ions of chemical elements of the fourth or eighth group of the periodic table (for example, carbon or helium ions). For instance, in the case of hydrocarbon ions, the implant may be performed with a dosage of $2 \cdot 10^{15}$ cm$^{-2}$ and with an energy of 100 keV. In this way, as compared to the substrate 4, the preliminary regions 40' have one and the same doping level, but are characterized by a different morphological structure, since they have an amorphous structure, instead of a lattice structure, and hence have a high lattice defectiveness as compared to the non-implanted portions of the substrate 4. In other words, the operations of implantation locally damage the lattice structure of the substrate 4. Moreover, to a first approximation, the preliminary regions 40' have the same shape and arrangement as the ones described with reference to the gettering regions 40, and hence are arranged at the aforementioned distance k from the first surface $S_1$.

Figure 10:
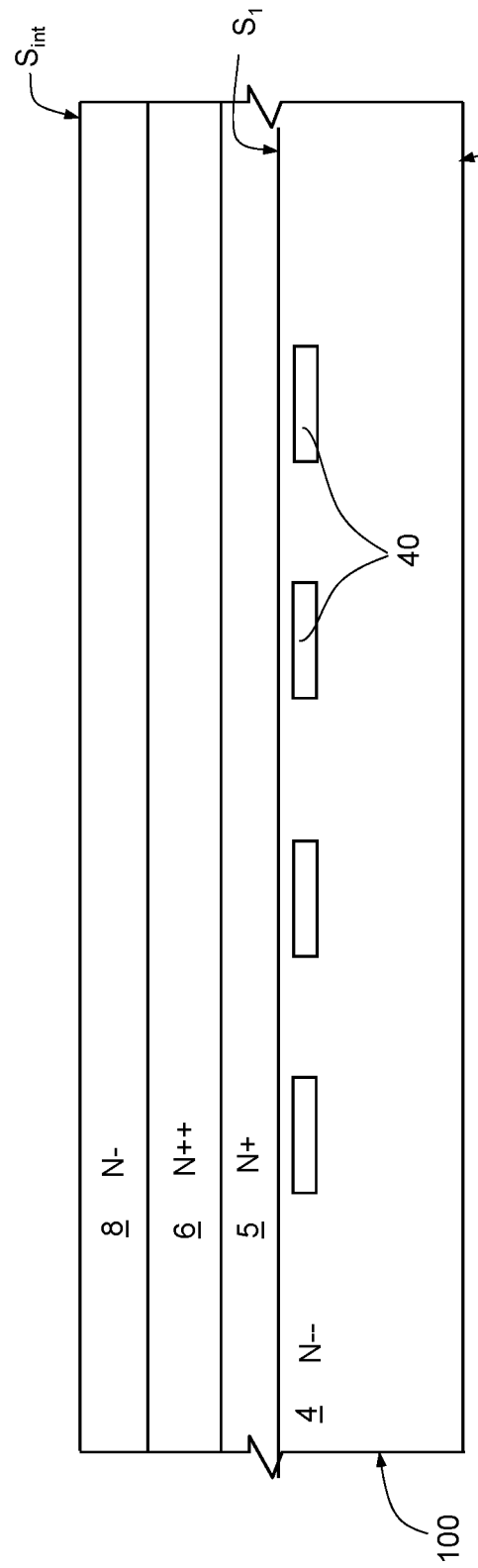

Next, as shown in FIG. 10, the mask 64 is removed, together with the bottom dielectric layer 62, for example by means of a wet etch. Furthermore, processes of epitaxial growth are carried out in order to grow the first, second, and third epitaxial layers 5, 6, 8. In this connection, the growth processes occur at a temperature, for example, of (approximately) 1100 C. Consequently, the processes of epitaxial growth also function as thermal annealing in regard to the preliminary regions 40', transforming the latter into the gettering regions 40.

Figure 11:
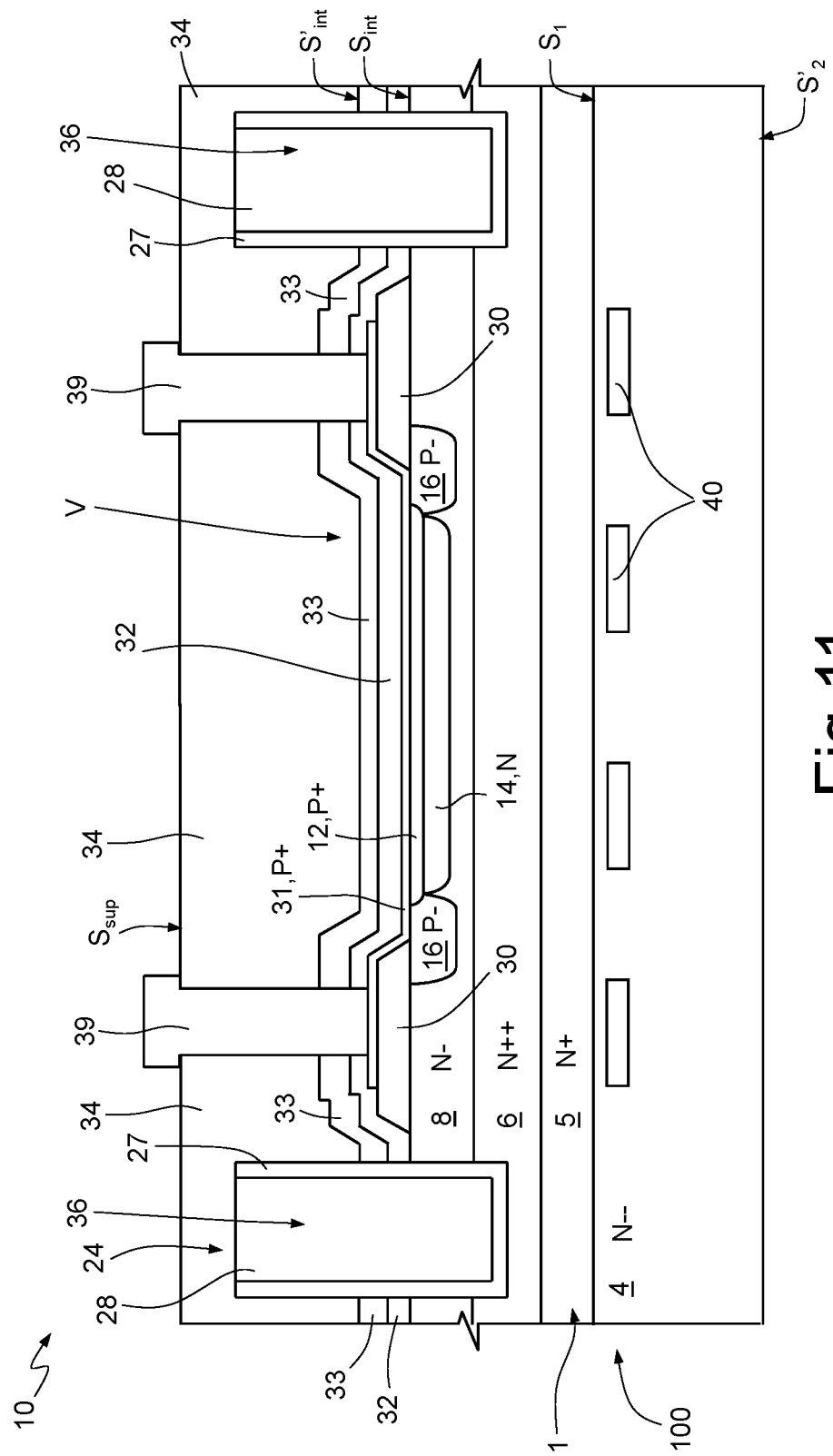

Next, a front machining of the die 100 is carried out, in a way in itself known and hence not described herein. In this way, as shown in FIG. 11, the anode region 12, the enriched region 14, the guard ring 16, the first, second, third, and fourth dielectric regions 30, 32, 33, 34, the intermediate region 31, and the lateral insulation region 24 are formed.

Figure 12:
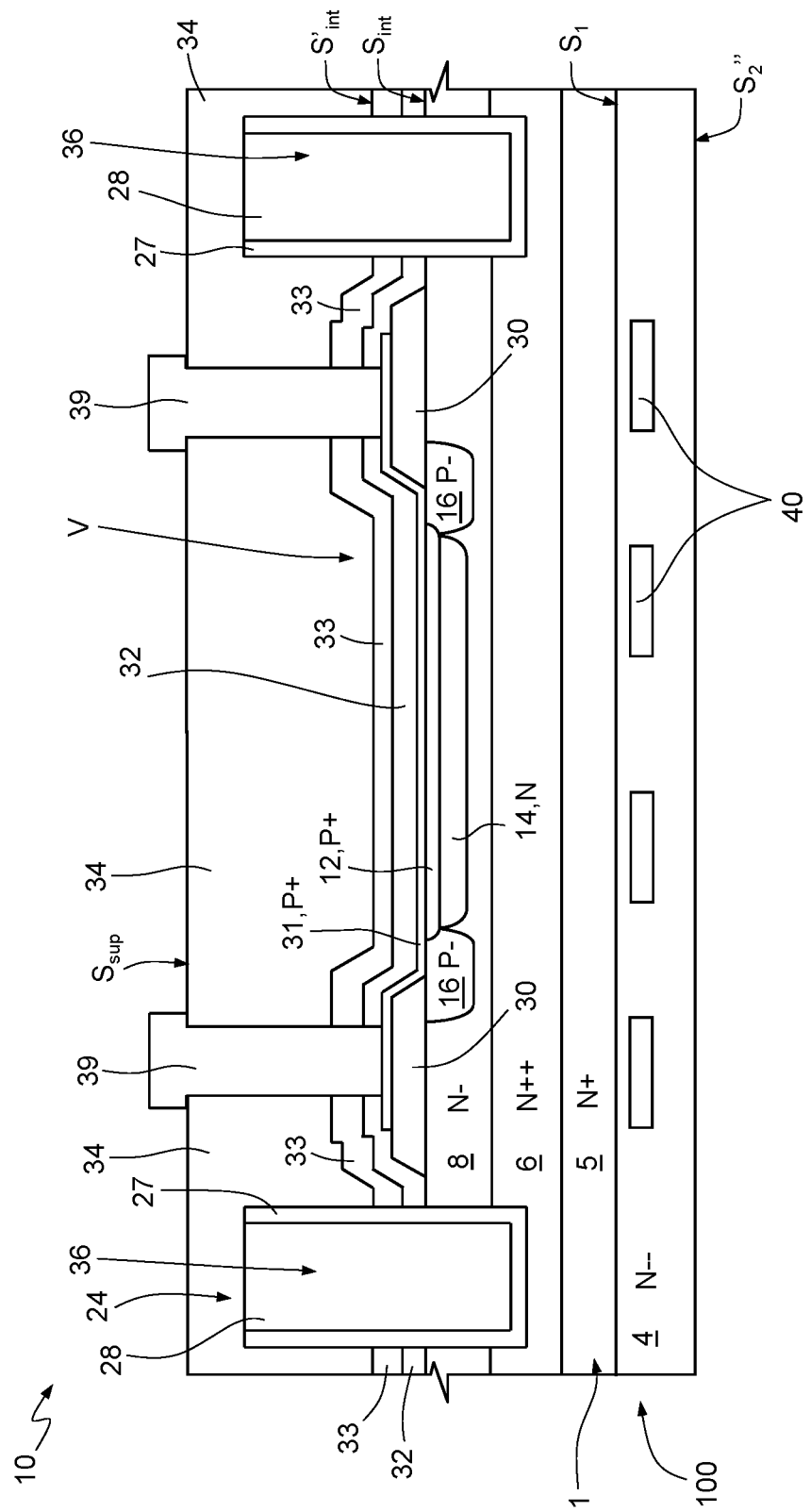

Next, as shown in FIG. 12, a back-grinding process is carried out so as to reduce the thickness of the substrate 4. At the end of this operation, the substrate 4 is delimited at the bottom by a second temporary surface $S_2''$.

Figure 13:
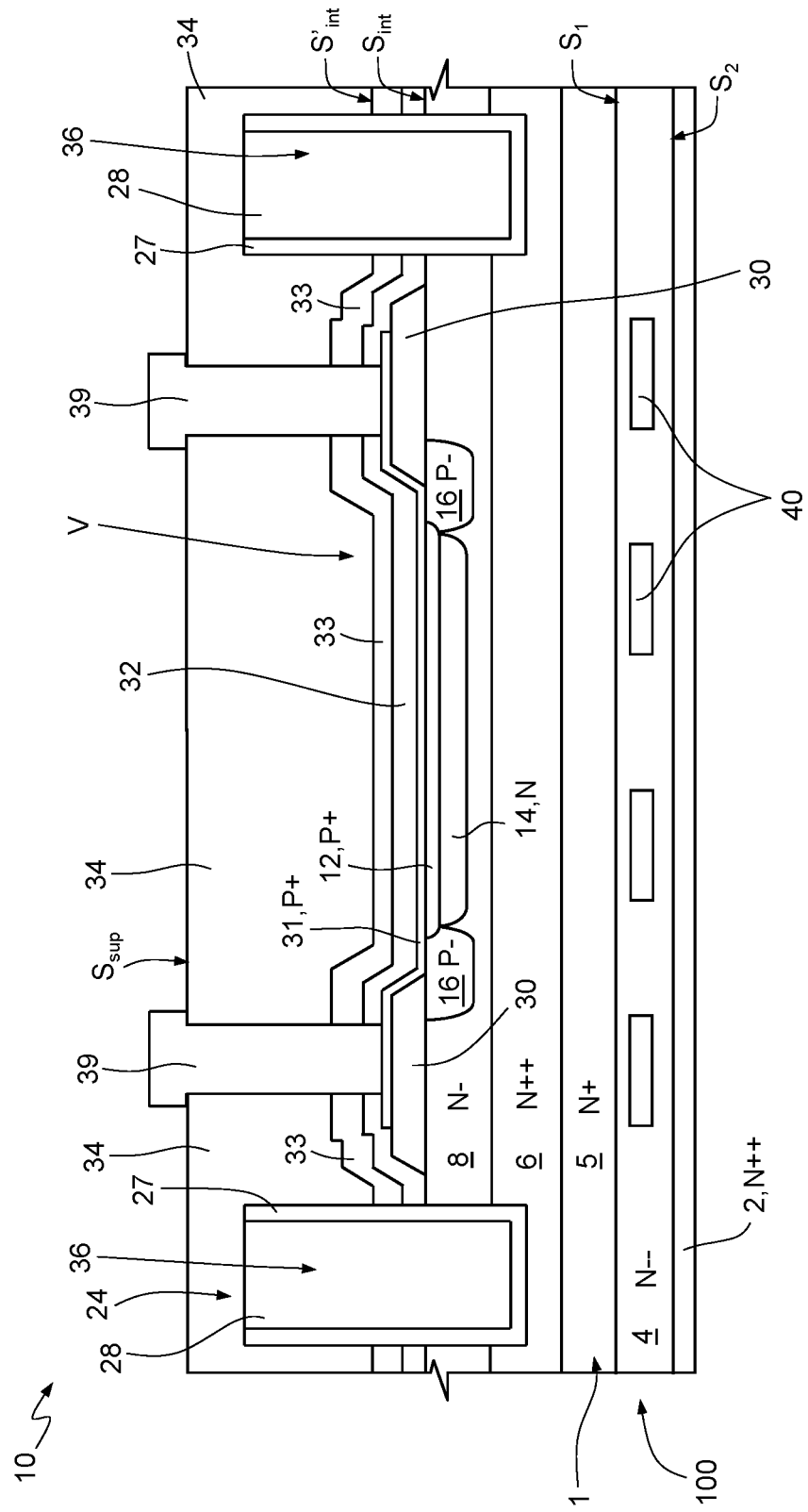

Next, as shown in FIG. 13, a back implantation of the die 100 is carried out so as to form the rear contact region 2. At the end of this operation, the substrate 4 is delimited at the bottom by the second surface $S_2$. Next, the cathode metallization 42 is formed.

The advantages that the present photodiode affords emerge clearly from the foregoing discussion. In particular, the present photodiode is a detector with two terminals that is characterized by a low noise, without it being necessary to reduce the overvoltage of use and/or the active area. Moreover, this photodiode does not require any further terminals in addition to the aforementioned two terminals. Consequently, the photodiode can be integrated in arrays with a high fill factor, and hence with a large area and a high sensing efficiency, without jeopardizing the signal-to-noise ratio.

In addition, the manufacturing process proposed envisages forming the gettering regions in the proximity of the junction, and hence enables activation the gettering mechanism by means of thermal processes characterized by a relatively short duration and relatively low temperature, compatible with manufacturing processes (for example) of a CMOS type. In this way, the process proposed is compatible with manufacturing of thin surface junctions, and hence makes it possible to obtain SPADs with a high sensing efficiency and a low breakdown voltage.

Figure 14:
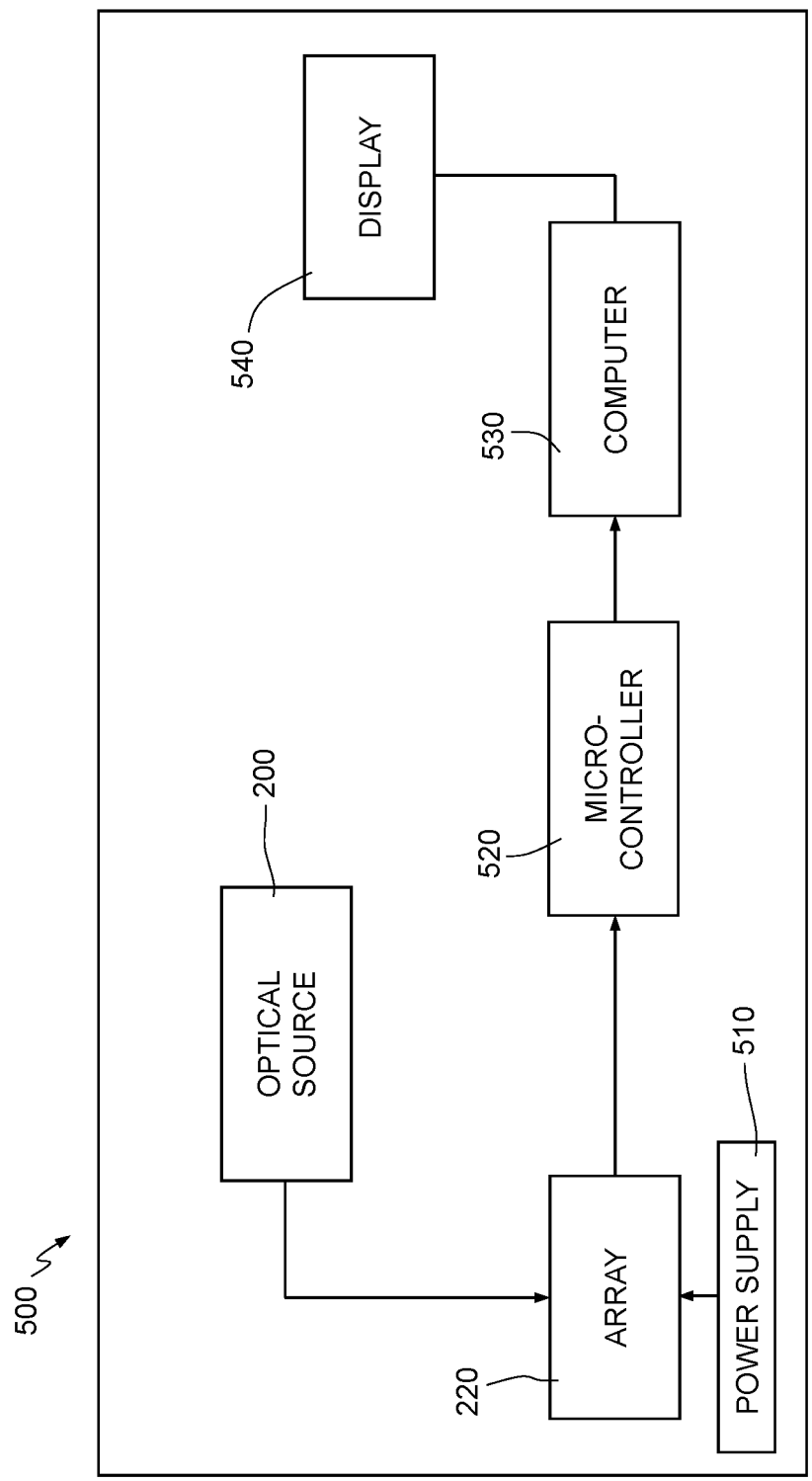
FIG. 14 shows a block diagram of a system including an array of photodiodes.

As regards possible applications, FIG. 14 shows how the array 220 can be used in a sensing system 500, which includes a light source 200 designed to illuminate the array 220, which is biased by a power supply 510 and is connected to a processor or microcontroller unit 520, possibly by interposition of a pre-amplification stage (not illustrated). The microcontroller unit 520 processes the output signal of the array 220 and supplies a processed signal to a computer 530, which enables analysis of said processed signal and display of the information associated to said processed signal on a display 540. In a way in itself known and hence not illustrated, the microcontroller unit 520 may comprise an analog-to-digital converter and a microcontroller, arranged downstream of the analog-to-digital converter.

Finally, it is clear that modifications and variations may be made to the photodiode described, without thereby departing from the scope of the present disclosure.

As mentioned previously, the number of epitaxial layers and the corresponding thicknesses and doping levels may vary with respect to what has been described.

The types of conductivity may be reversed with respect to what has been described, in which case the aforementioned minority carriers are electrons; the substrate and the epitaxial layers may continue to have doping levels decreasing in the direction of the substrate.

Instead of the silicon, a different semiconductor material may be used.

The anode region 12, instead of facing the intermediate surface $S_{int}$, may be overlaid by a top region of an N type; in this case, the PN junction is at a greater depth than what has been described previously.

The guard ring 16 and/or the enriched region 14 may be absent or may have characteristics different from what has been described.

The lateral insulation region 24 may differ from what has been described, both as regards the geometry and as regards the structure and materials. The lateral insulation region 24 may even be absent.

In addition, the number, geometrical characteristics, and materials of the dielectric regions arranged over the intermediate surface $S_{int}$ may vary with respect to what has been described. For example, the second dielectric region 32 may be absent.

It is likewise possible for the gettering regions to be formed in an epitaxial layer, instead of in the substrate. In this case, the manufacturing process envisages that the mask 64 is formed on a preliminary semiconductive structure (not shown), which includes the substrate and the epitaxial layer in which the gettering regions and possible intermediate epitaxial layers will be formed. At least one further epitaxial layer will then be formed on said preliminary semiconductive structure.

Figure 15:
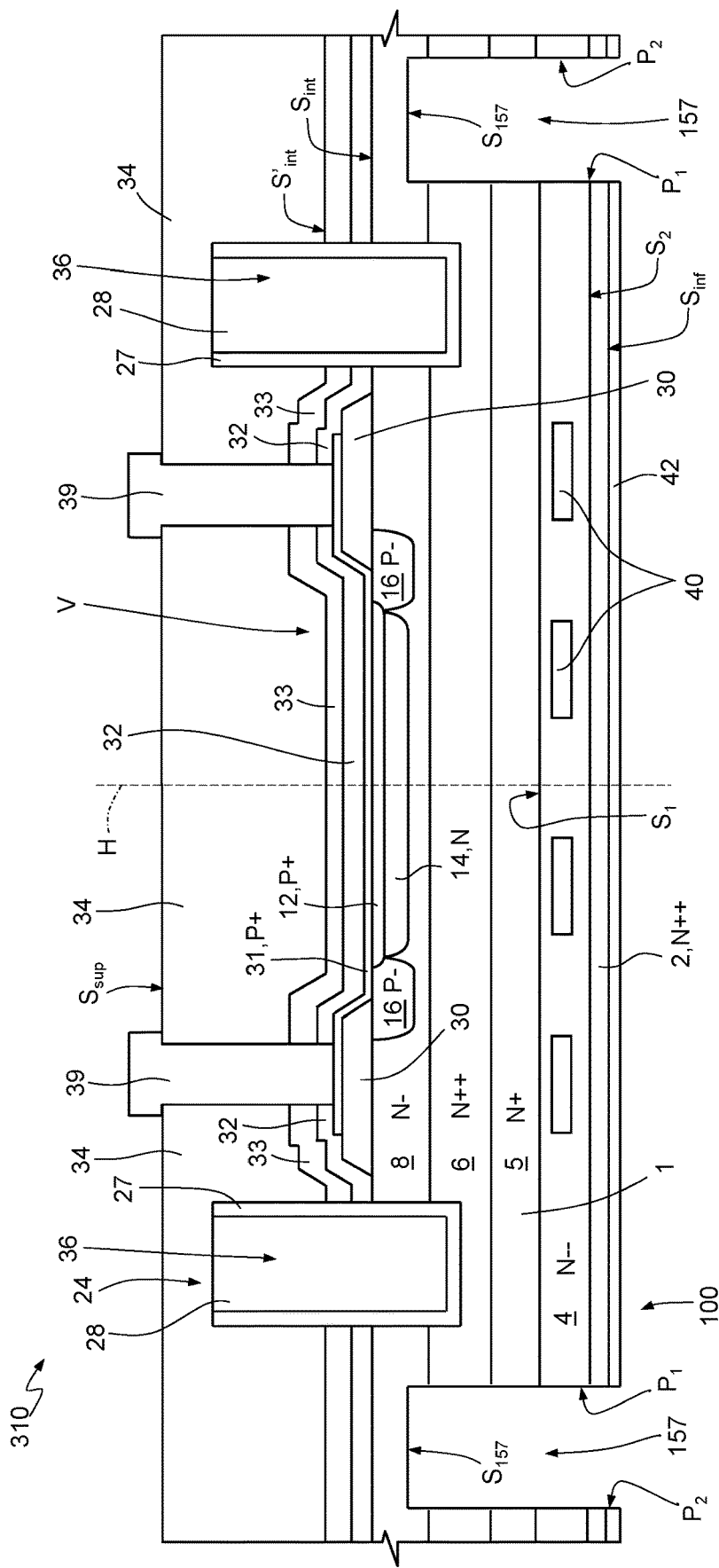
FIG. 15 is a schematic perspective view of another photodiode, in accordance with one or more embodiments.

It is moreover possible to implement the variant shown in FIG. 15. The photodiode 310 shown in FIG. 15 may include features which are substantially the same or similar to features of the photodiode 10 shown and described with respect to FIG. 1, and some of the differences will be discussed below. In the photodiode 310, on the outside of the lateral insulation region 24 a cavity 157 is present, which extends starting from the bottom surface $S_{inf}$, through the cathode metallization 42, the rear contact region 2, the substrate 4, the first and second epitaxial layers 5, 6, and part of the third epitaxial layer 8. In particular, the cavity 157 is delimited by a top cavity wall $S_{157}$, formed by the third epitaxial layer 8 and having, for example, the shape of an annulus, in top plan view. The cavity 157 hence has an annular shape and is laterally delimited by a first side wall $P_1$ and a second side wall $P_2$ having the shape of coaxial cylindrical walls, with axis coinciding with the axis of symmetry H.

In practice, the embodiment shown in FIG. 15 envisages a reduction of the thickness of the semiconductor material in an electrically inactive space of the photodiode. This reduction of the thickness of the semiconductor material enables a further reduction of the likelihood of absorption of the secondary photons, and hence the likelihood of generation of the aforementioned minority carriers.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensing system, comprising:
an array of Geiger-mode avalanche photodiodes integrated in a semiconductor die, each respective Geiger-mode avalanche photodiode of the array of Geiger-mode avalanche photodiodes including:
a substrate;
a front epitaxial layer on the substrate, the front epitaxial layer having a first conductivity type;
an anode region extending into the front epitaxial layer, the anode region having a second conductivity type that is different from the first conductivity type;
a plurality of gettering regions in the substrate;
a first dielectric layer on the front epitaxial layer, the first dielectric layer defining a recess that exposes the anode region; and
a second dielectric layer on the first dielectric layer, the second dielectric layer extending into the recess;
an intermediate layer on the first dielectric layer and in contact with the anode region in the recess; and
a light source optically coupled to the array of photodiodes, the light source configured to illuminate the array of photodiodes; and
microcontroller circuitry electrically coupled to the array of photodiodes, the microcontroller circuitry configured to receive an output signal of the array.

2. The sensing system according to claim 1, wherein each respective Geiger-mode avalanche photodiode of the array of Geiger-mode avalanche photodiodes further includes:
a third dielectric layer on the second dielectric layer; and
a fourth dielectric layer on the third dielectric layer,
wherein the third and fourth dielectric layers are made of different materials.

3. The sensing system according to claim 2, wherein each respective Geiger-mode avalanche photodiode of the array of Geiger-mode avalanche photodiodes further includes the intermediate layer is a polysilicon layer.

4. The sensing system according of claim 3, further comprising a guard ring extending into the front epitaxial layer and extending around the anode region.

5. The sensing system according to claim 4, wherein the intermediate layer is on the guard ring and the first dielectric layer is on the guard ring.

6. The sensing system according to claim 1, wherein each respective Geiger-mode avalanche photodiode of the array of Geiger-mode avalanche photodiodes includes further includes one or more epitaxial layers between the front epitaxial layer and the substrate.

7. The sensing system according to claim 6, wherein the one or more epitaxial layers have the first conductivity type.

8. The sensing system according to claim 7, wherein the one or more epitaxial layers have a different doping level relative to the front epitaxial layer.

9. The sensing system of claim 1, wherein each respective Geiger-mode avalanche photodiode of the array of Geiger-mode avalanche photodiodes further includes a rear contact layer on a side of the substrate facing away from the front epitaxial layer.

10. The sensing system of claim 9, wherein each respective Geiger-mode avalanche photodiode of the array of Geiger-mode avalanche photodiodes further includes:
a cathode metallization on the rear contact layer; and
an anode metallization that extends through the front epitaxial layer and the second dielectric layer to the intermediate layer and contacts the intermediate layer on the first dielectric layer.

11. A Geiger-mode avalanche photodiode, comprising:
a substrate including a first surface and a second surface opposite to the first surface;
a plurality of stacked epitaxial layers on the first surface, the plurality of epitaxial layers having a first conductivity type, the plurality of epitaxial layers includes a front epitaxial layer includes a third surface that is exposed from the plurality of stacked epitaxial layers;
an anode region with a second conductivity type different to the first conductivity type within the front epitaxial layer and exposed at the third surface of the front epitaxial layer;
a first dielectric layer on the third surface of the front epitaxial layer;
a recess extending into and through the first dielectric layer exposing the anode region;
an intermediate layer within the recess, on the first dielectric layer, and on the anode region;
a second dielectric layer on the first dielectric layer, the intermediate layer, and the third surface of the epitaxial layer, the second dielectric layer is within the recess, and the second dielectric layer has the second conductivity type; and
an anode metallization extending into and through the second dielectric layer to the intermediate layer, and the anode metallization is in contact with the intermediate layer.

12. The photodiode of claim 11, further comprising:
a third dielectric layer on the second dielectric layer; and
a fourth dielectric layer on the third dielectric layer.

13. The photodiode of claim 12, wherein the anode metallization extends through the fourth dielectric layer, the third dielectric layer, and the second dielectric layer to the intermediate layer.

14. The photodiode of claim 12, wherein:
the third dielectric layer is a silicon nitride layer, and
the fourth dielectric layer is a TEOS oxide layer.

15. The photodiode of claim 12, further comprising:
a channel-stopper region extending through the third dielectric layer, through the second dielectric layer, and into the plurality of stacked epitaxial layers; and
a barrier region extending through the third dielectric layer, through the second dielectric layer, and into the plurality of stacked epitaxial layers.

16. The photodiode of claim 15, wherein the channel-stopper region is between the barrier region and the plurality of stacked epitaxial layers.

17. The photodiode of claim 11, wherein the intermediate layer is a polysilicon layer.

18. A sensing system, comprising:
an array of Geiger-mode avalanche photodiodes integrated in a semiconductor die, each respective Geiger-mode avalanche photodiode of the array of Geiger-mode avalanche photodiodes including:
a substrate;
a front epitaxial layer on the substrate, the front epitaxial layer having a first conductivity type;
an anode region extending into the front epitaxial layer, the anode region having a second conductivity type that is different from the first conductivity type;
a plurality of stacked dielectric layers on the front epitaxial layer;
an intermediate layer on a respective dielectric layer of the plurality of stacked dielectric layers, in contact with the anode region, and the intermediate layer separates the anode region from the plurality of stacked dielectric layers; and
a light source optically coupled to the array of photodiodes, the light source configured to illuminate the array of photodiodes;
microcontroller circuitry electrically coupled to the array of photodiodes, the microcontroller circuitry configured to receive an output signal of the array; and
a power supply coupled to the array of photodiodes to bias the array of photodiodes.

19. The system of claim 18, wherein the intermediate layer is a polysilicon layer.

20. The system of claim 18, wherein the first conductivity is an N-type conductivity and the second conductivity is a P-type conductivity.

* * * * *